ERROR BURST DECODER FOR CONVOLUTIONAL CORRECTION CODES

Filed March 10, 1965 4 Sheets-Sheet 1

United States Patent Office 3,469,236

Patented Sept. 23, 1969

3,469,236

ERROR BURST DECODER FOR CONVOLUTIONAL CORRECTION CODES

Robert G. Gallager, Lafayette, Calif., assignor to Codex Corporation, Cambridge, Mass., a corporation of Delaware Filed Mar. 10, 1965, Ser. No. 438,565
Int. Cl. G06f *11/04*
U.S. Cl. 340—146.1 17 Claims

ABSTRACT OF THE DISCLOSURE

Convolutional code decoder has circuitry for forming and examining syndrome digits to locate the leading edge of an error burst and for correcting errors in the assumed burst on the basis of a further syndrome digit. Shown in combination therewith are circuitry for locating the trailing edge of the burst, circuitry for operating alternatively in error burst correction and random error correction modes, and specific circuitry for correcting systematic convolutional codes in which each parity digit is positioned close in the digit stream to one of the information digits it checks. Interrelated counters are shown to track the leading and trailing edges proceeding through the decoder to control the correction procedure.

The purpose of the present invention is to provide an improved decoding scheme for correcting bursts of errors in digital data.

Another object of the invention is to provide a convolutional code decoding scheme, including a decoder construction and method of operation, which has an improved burst length to guard length ratio and relatively small storage requirements.

Another object is to provide an error burst decoding scheme which can operate by logical analysis of the data alone, without having to analyze the operation of receiving equipment or the channel.

Another object is to provide a decoding scheme which is capable of correcting both random errors and error bursts with relatively small storage requirements.

Further objects are to provide an error burst decoding scheme which can employ simple logic and simple components, which has considerable flexibility with regard to code rate and correcting power and which can accommodate a number of error bursts at once under certain conditions.

Still further objects of the invention are to provide decoders suitable for use with communication channels such as H.F. (high frequency) and tropo (tropo scatter reflection) radio and telephone.

These and other objects and features of the invention will be explained below in conjunction with the drawings wherein.

Figure 1:
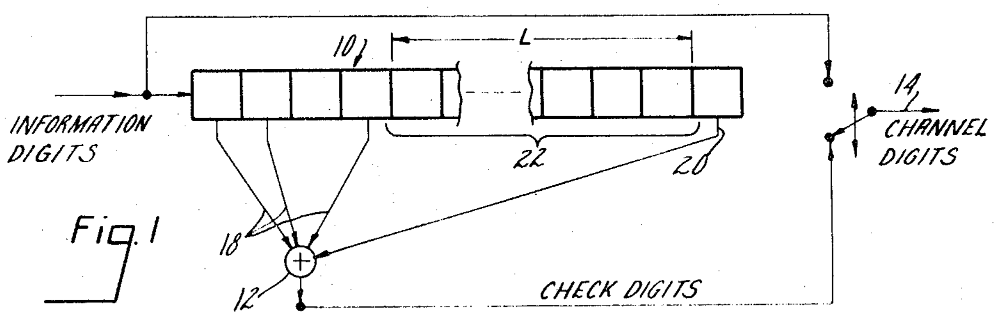
FIG. 1 is a diagram of a convolutional code encoder.

The present invention provides an improved concept with regard to locating error burst in sequentially processed convolutional codes. According to the invention, as the data stream proceeds through the decoder, a probabilistic determination is made, based upon the data itself, as to whether or not a predetermined region of the data stream lies within an error burst.

This concept differs markedly from certain prior concepts, in that there is no absolute guaranty that a burst of even a short length will be corrected. It is found, however, that the degree of probability of error burst correction of a given length can easily be made quite high, and that a performance virtually as good as a guaranteed scheme can be achieved. At the same time very significant advantages are obtained, one being a markedly short guard length between bursts relative to the number of storage stages of the decoder.

Advantageously, according to the invention, syndrome digits are progressively formed as the data stream proceeds into the decoder, and these are examined for the presence of nonzero digits. Certain predetermined patterns of nonzero digits are taken to indicate the probable presence of an error burst in a prespecified narrow region of the data stream, the location of this region being dependent upon the structure of the particular code being employed.

Advantageously, in the preferred case of systematic codes, i.e., where the information digits are transmitted unchanged the syndrome pattern to be examined in determining the existence of a burst at a particular point comprises one, or preferably a group of "locator" syndromes each of which has at least one information digit constituent located in a narrow region of the data stream in the vicinity of the point in question, and at least one additional information digit constituent outside of that region. All of the constituents outside of the narrow region are spaced from it in the same direction and at a distance greater than a predetermined error burst length, which herein will be termed the "maximum burst length" of the decoder. In addition to checking a given information digit to be decoded which lies in the narrow region, preferably syndromes of the locator group check a number of other digits lying closely adjacent to that digit. (Though advantageous, it is not essential in deciding whether an information digit is in a burst that the syndrome digits of the locator group check the very information digit in question.) By increasing the number of syndromes checking adjacent digits the probability of detecting an error burst in the region rapidly increases.

According to another aspect of the invention the probabilistic location of an error burst just described is employed as one control for the sequential decoding of the digit in the narrow region. For a second control one or perhaps a number of "corrector" syndrome digits is employed for each information digit to be decoded. The corrector syndrome digit checks this digit, while having other information digit constituents spaced from the digit a distance greater than the maximum burst length, and in the direction opposite from those constituents of the locator syndrome digits which lie outside of the narrow region.

Preferably, according to this aspect of the invention, each syndrome digit serves as a corrector syndrome digit for one region of the data stream and as a locator syndrome digit for a region spaced a maximum error burst length away. This is made possible by the law of probabilities that a syndrome digit used for a correction will not be a syndrome digit indicating an error burst, and vice versa, which is a justifiable way of proceeding for many communication systems having error bursts of a probable finite length, and spaced substantially apart.

According to the invention, once a determination is made that an error burst is present in a narrow region of the data stream, it is permissible to assume that the burst has a considerably longer length. Thus a number of digits may be corrected, using successive corrector syndrome digits. It is advantageous, however, to continue the determination of the burst condition for each successive information digit, so as to restore the decoder to its original state as soon as possible, and thus minimize the guard space requirements.

Advantageously both the control of an initial correction by locator syndrome digits, and the termination of correction, as determined by later syndrome digits is facilitated by the use of simple counting circuitry. This is very advantageously accomplished according to the invention in a two mode decoder, having a random (or isolated) error correction mode as well as a burst correction mode. Such a decoder operates normally in the random error correction mode, employing the stream of locator syndrome digit, while a counter monitors the operation. When the counter detects that the decoder is attempting to make more corrections than is within its capability the counter switches to the burst mode, and causes the corrector syndrome digit to control the decoding.

Counters can also be advantageously employed in a single mode detector, one keeping track of the leading edge of a located burst, and the other the trailing edge, without the use of a syndrome register. In the case of single or two mode detectors having syndrome registers, a counter can be employed to judge the error pattern of the syndrome register at the time a decoding decision is required.

Numerous other features of the invention and further details of the features already discussed will be best explained by beginning with elementary principles of convolutional codes, and by referring to the drawings. This discussion concerns the modulo 2 alphabet which is currently the most widely used. The invention is applicable to all other alphabets in which the letters are elements of a finite field.

Since any decoding scheme must be preceded by appropriate encoding of the data before transmission, the encoding will first be described.

FIG. 1 shows a block diagram of a convolutional encoder for the preferred systematic codes. It is assumed that the data to be transmitted consists of a sequence of binary digits, 1's and 0's, called information digits and designated by the letter $i$. The information digits enter a shift register 10 as shown in FIG. 1, and as each new information digit enters, the old digits each shift one place to the right. Also after each new information digit enters, a check digit $p$ is calculated by adder 12. This check digit is the modulo 2 sum of a prespecified set of the digits in the register; the modulo 2 sum of a set of numbers is 0 if the ordinary sum is even and 1 if the ordinary sum is odd. The digits transmitted over the channel 14 are the information digits and check digits, one check digit after each information digit in this particular instance.

The rate of a convolutional code, R, is the ratio of information digits to the channel digits. For all the coding and decoding circuits of FIGS. 1 to 6, R will be taken as equal to ½; that is, there is one check digit for each information digit. All the rate ½ encoders to be discussed here are similar to FIG. 1 in that the check digit is the modulo 2 sum of a set 18 of information digits at the left end of the shift register and the one information digit 20 at the right end of the shift register, with a substantial span 22 of untapped shift register stages extending therebetween.

Figure 2:
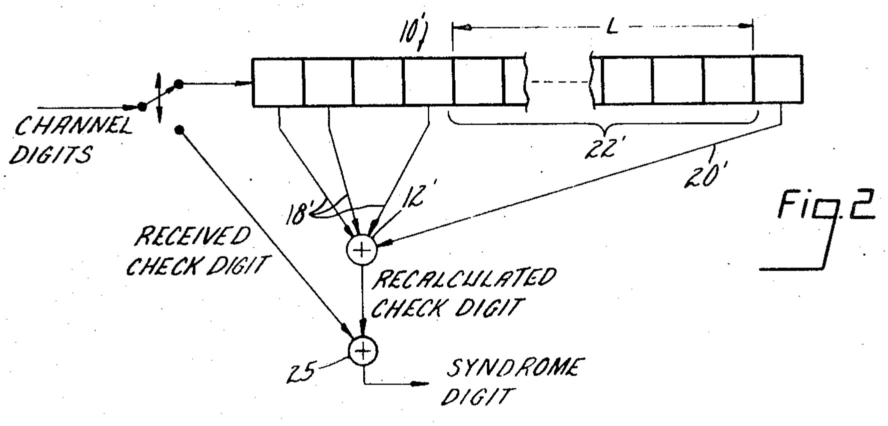
FIG. 2 is a diagram of a syndrome calculator.

Each of the decoders according to the invention can be thought of as containing three parts; a syndrome calculator, a syndrome burst indicator, and an error corrector. The syndrome calculator has the same form for all the rate ½ codes and is shown in FIG. 2. The syndrome calculator in FIG. 2 is almost the same as the encoder in FIG. 1, and the connections 18′ and 20′ to the shift register 10′ must be identical in the encoder and the syndrome calculator. The syndrome digits can be calculated by a separate added 25 (FIG. 2) in which the output of adder 12′ and the corresponding received check digit $p$ from the channel are added together. Similarly the received $p$ may be applied as an additional input to adder 12′ (see FIG. 3), and the added 25 could be omitted. It can be seen that if there are no errors in the received data, then each recalculated check digit must agree with the corresponding received check digit $p$ and consequently each syndrome digit $s$ is 0. Let the reader suppose however, that after a long period with no errors on the channel, a burst of errors begins to enter the decoder. While there are digits in error in the left hand side of the shift register 10′, each syndrome digit being calculated might be either 1 or 0 depending on the particular location of the errors. It is extremely unlikely, however, that many errors will enter the shift register before at least one syndrome digit is 1. Typically a burst of syndrome 1's will be formed during the time that a burst is entering the decoder. According to the main principle of the invention, these syndrome 1's are used as locators to detect the location of the bursts of channel errors; furthermore, when an erroneous information digit in a burst gets to the right hand side of the shift register, it will generate through tap 20′ another syndrome 1. This additional syndrome 1 (the "corrector" syndrome) plus the knowledge that a burst is at the right hand end of the shift register (obtained from the "locator" syndromes) allows a correction to be made.

In the remainder of this application there will be discussed the details of recognizing error bursts from bursts of syndrome 1's, but the above idea provides the essential difference between the decoding schemes discussed here and other kinds of decoding schemes. In order to make the above idea clearer, I now describe explicitly how the code in FIG. 1 can be decoded.

Figure 3:
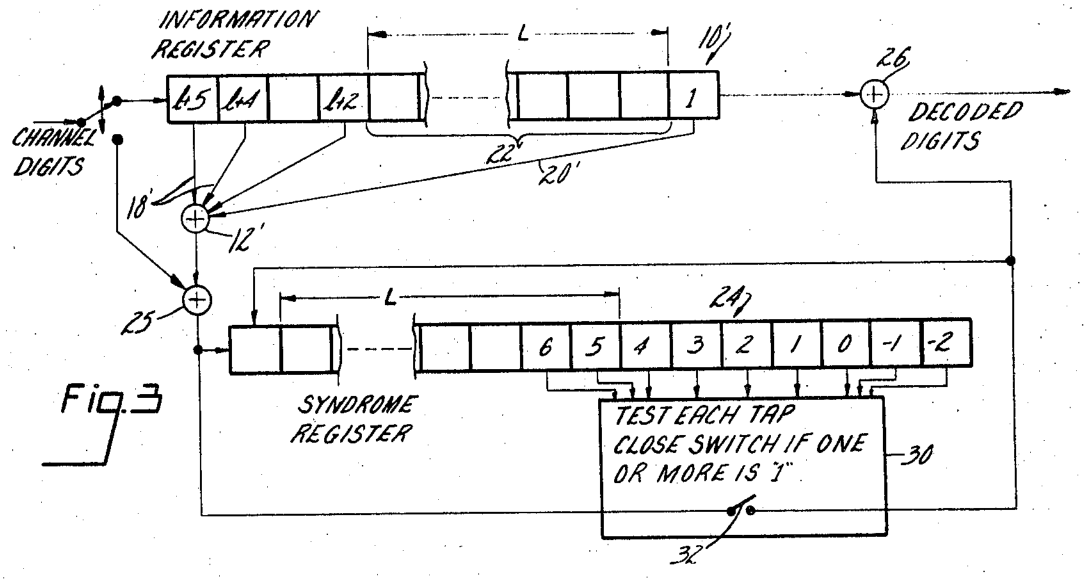
FIG. 3 is a diagram of a decoder according to the present invention.

Referring to FIG. 3, when a burst of errors comes into the decoder, the errors generate a burst of syndrome ones which move down the syndrome register 24 as the errors in information digits move down the information register 10′. When the first information digit in error gets to position 1, the first syndrome also is at position 1 in the syndrome register. At that time, assuming that the burst is completed at the left end of the register (i.e., the information digits in positions $L+2$, $L+4$ and $L+5$ are correct and the check digit entering the decoder is correct) the new syndrome digit will be 1 due to the error in position 1 of the information register. Also there will be some 1's in syndrome positions −2 to 6, and therefore the error will be corrected by correction circuit 30 which examines each of the locator syndromes in positions −2 to 6 and closes switch 32 if one or more is 1. By closing switch 32 the corrector syndrome for position $L+5$ is also conducted to added 26 where it is added modulo 2 to $i$ at position 1, thereby performing a correction.

It should be observed that several of the group of locator syndromes at positions −2 to 6 (which checks a narrow region of the data stream, i.e., $i_{-5}$ to $i_6$) do not check $i_1$, the digit being decoded. Also, as is preferred, the locator syndromes are immediately adjacent one another.

It is next appropriate to consider the types of situations under which the decoder in FIG. 3 will not work correctly. The first way that the decoder can fail is if the burst is too long. If the first digit in error is a check digit, this will cause a syndrome 1 to be generated. If, by the time that syndrome 1 gets to position 6 of the syndrome register 24, there is an information digit in error in position $L+2$, a new syndrome 1 can be generated and a decoding error will result. If L is equal to 70 this corresponds to a burst of 132 channel digits (66 information digits) from beginning to end, and therefore we say that the nominal burst correcting length is 131 channel digits. This burst correcting length can be greatly increased by increasing the length of L in the information and syndrome registers in FIG. 3 (and likewise the encoding shift register length in FIG. 1). For this particular embodiment if the overall length of the information register is $m$, then the nominal burst correcting length is $2m-19$. In terms of L, the nominal length is $2L-9$.

The next way in which the decoder in FIG. 3 can fail is if two bursts are too close together. If the last digit of a first burst is an information digit and generates a syndrome 1 when it is in position $L+2$, and the first digit of the next burst is a check digit, coming in when the last syndrome 1 of the previous burst is at position $-2$, then a decoding error will result. A little counting will convince one that if I equals 70, these errors are 162 digits apart, and thus the nominal required guard space for this embodiment is 161 digits. If the information register is $m$ digits long, then for this embodiment the nominal required guard space is $2m+11$ channel digits. In terms of L the guard space is $2L+21$.

The final way in which the decoder in FIG. 3 can fail is if a sufficiently peculiar pattern of errors occur that they cancel each other in the syndromes. In these circumstances the syndrome burst indicator fails (i.e., no ones appear in positions $-2$ to $+6$ of the syndrome register). One example of this is the following burst in which a 1 appearing below an $i$ or $p$ digit indicates an error in that digit:

$$p_4\ i_4\ p_3\ i_3\ p_2\ i_2\ \ p_1\ i_1$$

$$\ldots 0\,0\,0\,1\,0\,0\,0\,1\,0\,1\,1\,0\,0\,0\,0 \ldots$$

No syndrome 1's will be developed by this burst in the embodiment of FIGS. 1–3 until it is at the right hand end of the decoder, and thus correction will fail.

The occasional failure exhibited here is a necessary part of all the decoding schemes of the present invention. In fact, if a code of rate ½ corrects all bursts of length $b$ or less so long as they are separated by a guard space of $g$ or more digits, it can be shown that $g/b \geqslant 3$. When the length of the information register $m$ is greater or equal to 18, the nominal burst length and guard space just described will violate this condition, and thus it is proven that there must be some bursts that are uncorrectable.

According to the invention however, the probability of the syndrome burst indicator failing can be reduced by tapping the shift register in more places at the left end. When this is done, however, the nominal burst length is reduced and the nominal guard space is increased.

The previous embodiment is quite satisfactory in terms of bursts and guard spaces, but certain other difficulties can arise on telephone lines, H.F. circuits, and tropo circuits. On all of these channels, there is a reasonably large probability of having isolated or random errors, e.g., just 2 single errors, or two discrete small bursts of errors, separated by somewhat more than the nominal burst length. The decoder in FIG. 3 will make a decoding error here with just as great a probability as if there had been a severe burst of slightly more than the nominal burst length. The next decoder to be described (see FIG. 4) has a different kind of syndrome burst indicator and is specifically adapted to be able to correct either long bursts or many isolated errors.

Figure 4:
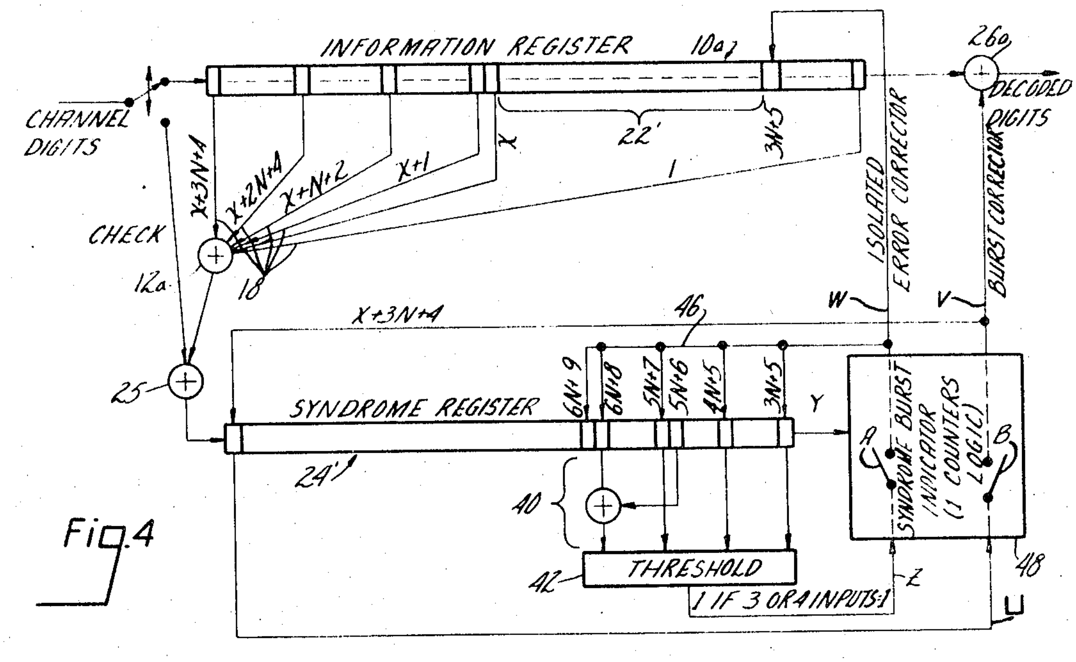
FIG. 4 is a diagram of one prefered embodiment of the invention.

The encoder for the decoder in FIG. 4 is the same as that in FIG. 1, except the taps on the shift register are in the same places as the taps on the information register 10*a* in FIG. 4. The numbers $n$ and $x$ in FIG. 4 are counted to the left from position 1. To provide an idea of reasonable orders of magnitude $n$ may be taken as 2 and $x$ as 100.

Figure 5:
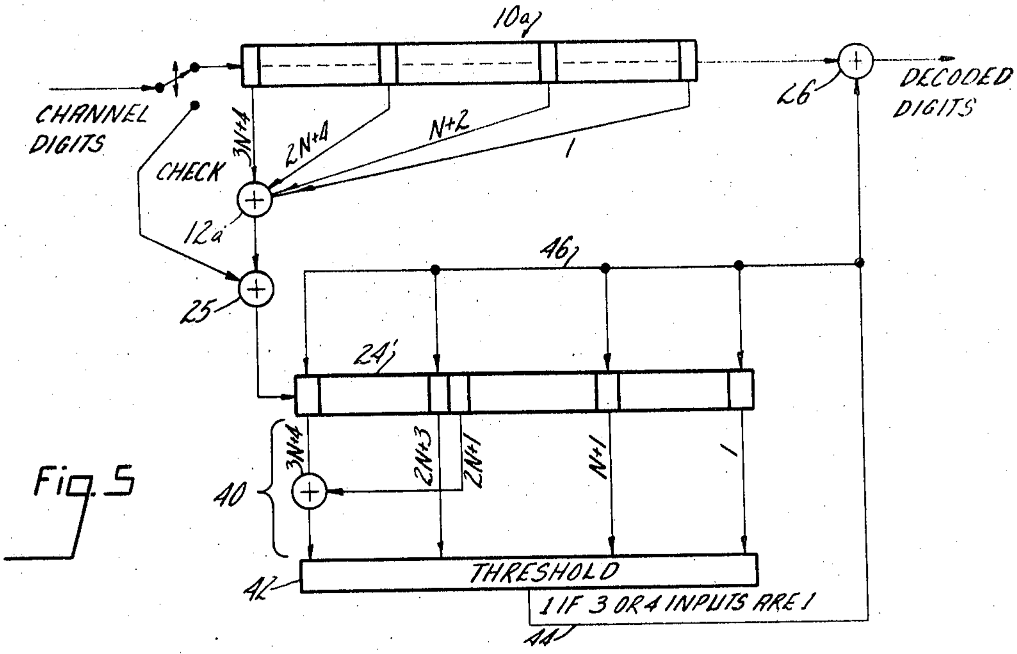
FIG. 5 is a diagram of a diffuse convolutional decoder embodied in FIG. 4.

The leftmost four of the taps 18 on the information register 10*a* in FIG. 4 correspond to a diffuse convolutional decoder for correcting either 2 isolated channel errors or a burst of $2n$ channel errors (see FIG. 5). For a description of diffuse decoders reference is made to the U.S. patent application Ser. No. 383,387, filed July 17, 1964, by Arthur Kohlenberg.

Basically, in addition to the special diffuse distribution of the information digit taps, this decoder incorporates the syndrome adder 25 (or its equivalent, a received $p$ input to adder 12*a*) the syndrome shift register 24' means 40 for producing a set of syndromes (or "parity checks") orthogonal upon a given information digit to be decoded, e.g., $i$ at position $3n+5$, a threshold decision device 42 adapted to produce a correction digit on the basis of the set of syndromes and a line 44 for adding the correcting digit modulo 2 to the given information digit $i_{3n+5}$. A switch A is provided line 44, and when closed, permits the decoder to operate by the diffuse threshold decoding mode. A syndrome corrector line 46 is located beyond switch A, adapted to correct the later syndromes when an error is found.

It can be shown from the theory of diffuse convolutional coders and decoders that the diffuse decoder in FIG. 4 or 5 will correct all channel errors so long as every sequence of $3n+4$ pairs of digits ($6n+8$ channel digits altogether) contains no more errors than either 2 errors anywhere or a group of errors confined to $2n$ channel digits. If the syndrome burst indicator of FIG. 4 is operating so that switch A is closed and B is open, then FIG. 4 is the same as FIG. 5 except that the correction is delayed by $x-3n-4$ digits. The additional taps on the information register 10*a* in FIG. 4 at positions $x$ and 1 have no influence on this correction, until after the threshold decoder makes an error, but this will be discussed later.

Now suppose that a burst of more than $2n$ digits occurs for the decoder of FIG. 4. The diffuse convolutional decoder might fail under these circumstances, and it is the purpose of the syndrome burst indicator 48 to recognize this situation by analyzing the locator syndromes and to open switch A and close switch B, thus causing the decoder to operate according to the burst mode.

In the burst mode, the operation of the decoder in FIG. 4 is identical to that of the simple decoder in FIG. 3; that is, whenever an information digit in error gets to position 1 of the information register, a corrector syndrome 1 is generated in position $x+3n+4$ of the syndrome register 24' (this assumes no errors in the information digits at the left end of the register 10*a* and no error in the incoming check digit.)

The preceding discussion gives a qualitative idea of how the decoder in FIG. 4 works. To be more specific consider the details of how the syndrome burst indicator works. There are many ways in which such an indicator could work; the following is a reasonable compromise between operational simplicity and "optimum" performance.

Figure 6:
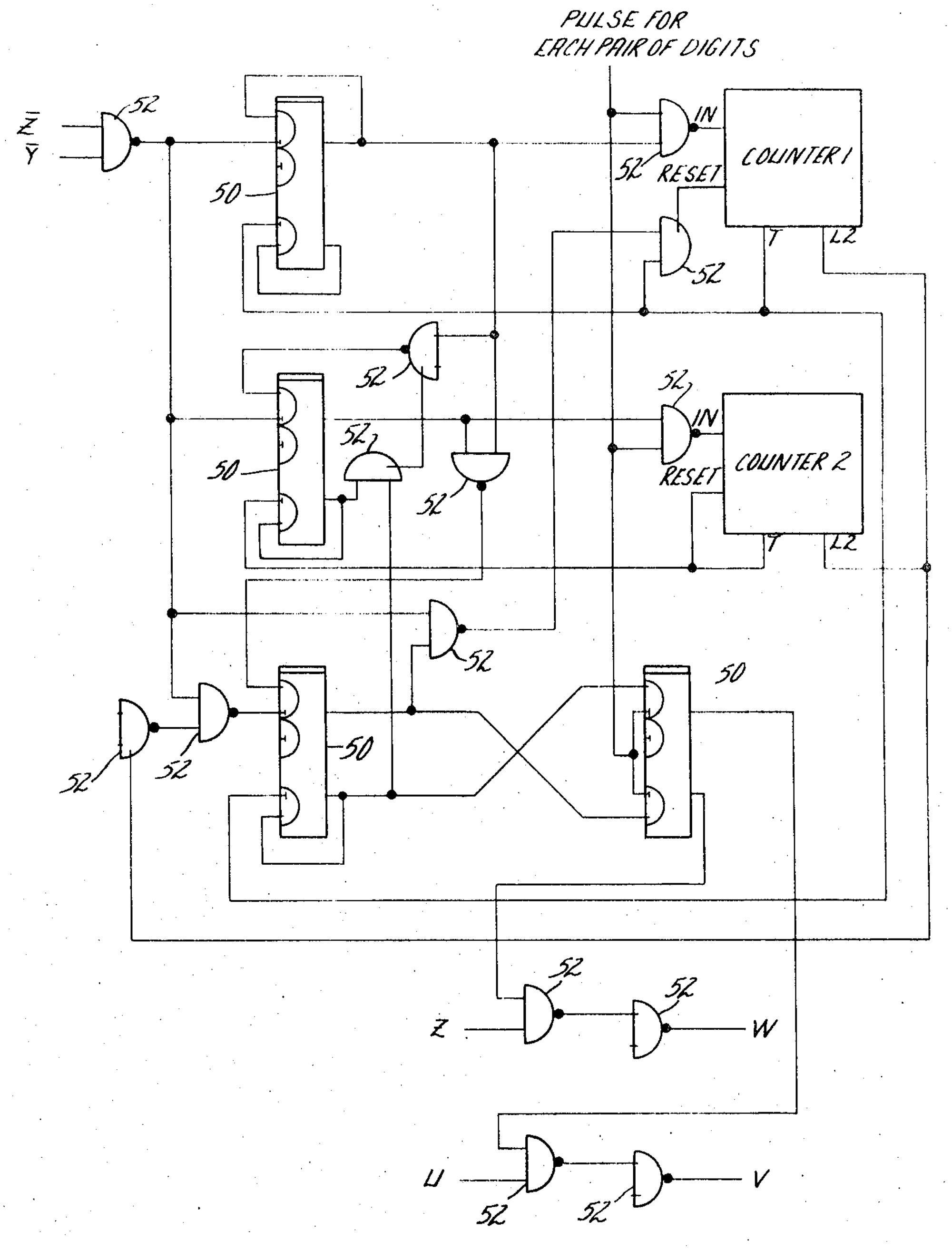
FIG. 6 is a wiring diagram of one possible syndrome burst indicator for the embodiment of FIG. 5.

The syndrome burst indicator (FIGURE 6) consists primarily of 2 counters, shown diagrammatically as square boxes 1 and 2 in the upper right hand portion of FIGURE 6. The purpose of the counters is to keep track of the two most recent occurrences of ones on leads $z$ and $y$, from the threshold device 42 and the extreme right end of the syndrome register 24'. A one on lead $z$ (represented as a zero on the "not $z$" lead $z$) indicates that the threshold decoder considers the information digit in position $3n+5$ to be in error. Physically all ones can be nega- occurring after the $z$ pulse and the resetting of the syndrome register 24' by line 46 indicates that the threshold decoder considers the parity digit corresponding to position $3n+5$ to be in error. Physically all ones can be negative 6 volt levels and all zeros zero volt levels.

Since the threshold decoder itself is analyzing a group of syndromes which check a narrow region of the data stream, in this case the relatively short constraint length of the diffuse code, these syndromes qualify as locator syndromes for use in locating bursts according to the present inveniton. Similarly, looking at the performance of the threshold decoder gives an indication, albeit indirect, of the 1's in the syndromes, hence the present embodiment operates according to the general principles outlined in the earlier summary.

The first pulse on leads $z$ or $y$ activates counter 1, and each successive pair of digits into the decoder increases its count $C_1$ by 1. The next pulse on leads $z$ or $y$ activates counter 2 and each successive pair of digits then also increases $C_2$ by 1. Successive pulses on $z$ and $y$ are ignored until either $C_1$ or $C_2$ gets up to $n+1$, in which case another 1 on either $z$ or $y$ turns on the burst mode by opening switch A and closing switch B. The rationale here is that the threshold decoder can handle a burst constrained to $n$ pairs of digits, but 3 errors separated by $n+1$ pairs of digits indicates that a longer error burst is present and that the threshold decoder might be in trouble, so the burst mode takes over.

If either counter gets up to a count of $3n+4$, the constraint length of the diffuse code, before the burst mode is entered, the counter resets itself to 0 and is deactivated, waiting for another $z$ or $y$ pulse before starting to count again. This is done because it is most probable that correct decoding has occurred for the part of the constraint length extending between the point where the counter started counting and the later point where the other counter started.

The thus leapfrogging counters cooperate to detect the leading edge of an error burst, and to switch the decoder to the burst mode.

Whenever the burst mode is entered, the count $C_1$ of the first counter is reset to zero but the counter is not deactivated; rather it serves to locate the trailing edge of the burst. Each subsequent $z$ or $y$ pulse resets $C_1$ to zero again. When the count $C_1=3n+4$ is reached, i.e., when no $z$ or $y$ pulses have occurred for $3n+4$ pairs of digits, it is most probable that a clean constraint length is present for the diffuse decoder. At this counter, counter 1 is deactivated, $C_1$ is reset to 0, the syndrome burst indicator is returned to its original state, and the decoder returned to the diffuse decoding mode.

While the burst mode is on counter $C_2$ is ignored. $C_2$ increases until it equals $3n+4$ and this point $N_2$ is reset to 0 and the counter is deactivated.

The logic just described is readily performed by the use of standard components. As one example, referring to FIG. 6, the entire logical circuit can be formed with gated flip-flop packs 50 and gate packs 52 as produced by Computer Controls Company of Framingham, Mass. In FIG. 6 that manufacturer's block diagrams are employed to indicate the proper wiring terminals, the packs being the manufacturer's series 200 kc. S-Pac digital modules, the packs designated 50 in FIG. 6 being modules "FA 20," the packs 52 being modules "DN 20," and the pack 53 being module "DC 20," according to the manufacturer's nomenclature.

Figure 7:
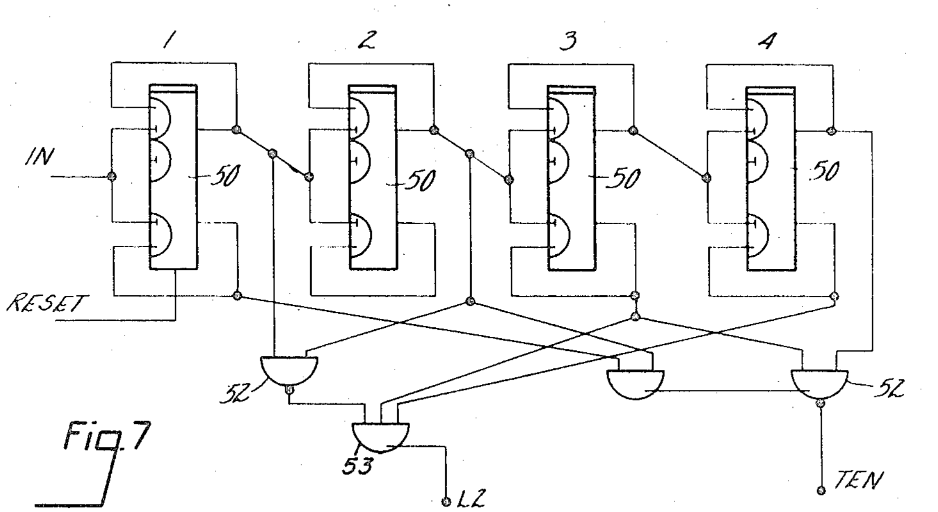
FIG. 7 is a wiring diagram of one possible counter circuit for use in the burst indicator of FIG. 6.

In FIG. 7 there is shown a counter circuit for each of the counters 1 and 2, using more of the modules described above.

In operation the count of the counter increases by 1 each time a "positive going step" (1 to 0 transition) appears at the upper input line at the left of FIG. 7. The count is reset to 0 by a "0" on the lower output line. The output at the lower right hand corner of the figure is 0 on count of 10 and is 1 (−6 volts) otherwise. Output L2 is 1 if the count is less than or equal to 2.

Needless to say, numerous other constructions are capable of performing the logic of the error burst detector.

At this point it is appropriate to discuss the purpose of the tap on the information register at position $x$ in FIG. 4. Without this tap, there are two code words which differ in only 5 positions, all within a span of $3n+4$ digits. If 3 of these 5 positions are received in error, the decoder will change the other 2, making it appear as if only 2 errors had occurred, thus not turning on the burst indicator. With the extra tap at position $x$, the closest pair of code words differs in 6 positions, and any 3 errors will appear at the output of the threshold decoder as at least three errors, thus guaranteeing that the burst mode will be entered. This incidentally also guarantees that any combination of three errors will ultimately be corrected by the decoder.

Next it is appropriate to consider the burst length and guard space reqirements for the code. The earliest the first counter can be activated when a burst enters the decoder is when the leading edge of the burst is at $4n+5$. To see this, observe that parity errors in positions $4n+5$, $5n+7$, and $6n+9$ will cause a false correction at $3n+5$, activating the first counter. The decoder can then enter the burst mode after $n+1$ pairs of digits, and be in the burst mode after $n+2$ pairs of digits. In this worst case, when the burst mode is first on, the leading parity digit in error will be at $3n+3$. Any information digits in error at positions $x$ or higher will then cause an uncorrectable error. Thus, any burst of length $2x-6n-7$ will be corrected if the burst indicator works.

Likewise, when the last information digit in a burst is at position $x$, a syndrome 1 can be at position $x+3n+4$, and no more syndrome 1's can enter the register until more errors occur. The burst mode will not be off until the final syndrome 1 of the burst reaches position 0, at which time the final error in the burst is at $3n-4$. At this point the leading edge of the next burst can be at $x+3n+4$ without causing errors. This makes a nominal guard space of $2x+12n+15$ digits. Actually, with this decoder, there are many combinations of errors that can occur in the guard space without hurting anything. All that is required is that no errors enter the decoder while the burst mode is on. For a short burst, the burst mode is on only for a very limited time, and therefore errors can occur anywhere else during the guard period.

The decoder of FIGURE 4 can clearly be generalized to using any other decoding scheme for convolutional codes in place of the threshold decoder. Threshold decoders for an arbitrary number of errors can be used. And in fact the scheme described here can be concatenated, using the decoder of FIGURE 4 in place of the threshold decoder, and adding another syndrome burst indicator to take care of bursts an order of magnitude longer than those taken care of by the original decoder.

Figure 8:
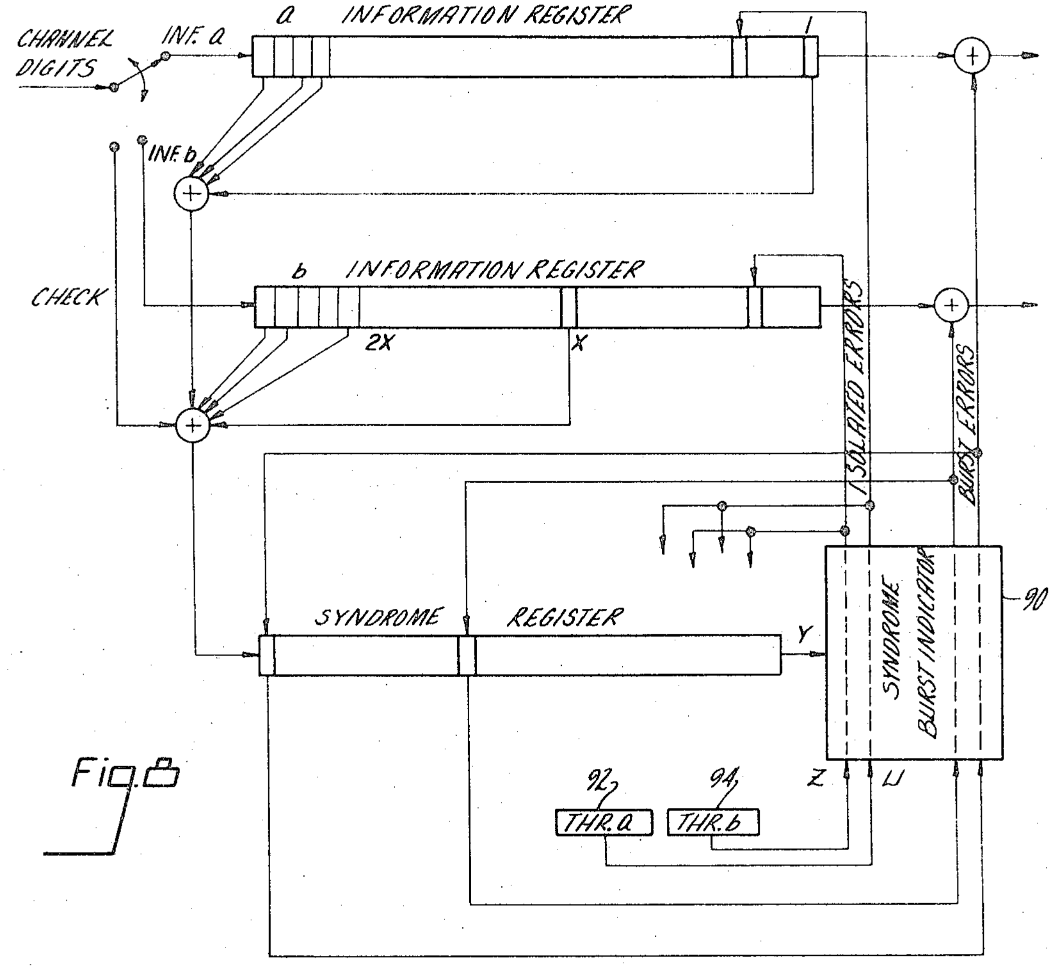
FIG. 8 is a diagram of a decoder for rate ⅔.

The scheme can be extended to code rates other than ½. FIGURE 8 is a block diagram of a decoder for rate ⅔ and it will be obvious to those skilled in the art how to generalize the scheme to an arbitrary rate of the form $$\frac{k-1}{k}$$

In order to simplify the diagram the details of the rate ⅔ threshold decoder have been left out. The principle of operation is the same as for rate ½. The syndrome burst indicator 90 tests the decoded output of the threshold devices 92, 94, and turns on the burst mode when the capability of the threshold decoder is exceeded. The nominal burst length is about $3x$ minus the constraint length of the threshold decoder, and the nominal guard space is about $6x$ plus twice the constraint length of the threshold decoder.

These and numerous other embodiments are possible using the concepts of the present invention.

I claim:

1. An error burst corrector for a digital data stream encoded by a predetermined convolutional code, the continually formed check digits of said code being such as are produced by linear combinations of information digits appearing at predetermined tapped positions in a memory through which the digit stream continuously proceeds, said code being of a type in which there is a series, of substantial length greater than the length of expected error bursts, of untapped positions in said memory extending from one of said predetermined positions to the next predetermined position, said corrector including a corrector memory through which digits of the encoded stream continuously proceed, said memory having taps at predetermined positions in accordance with said convolutional code, there being a series, of substantial length greater than the length of expected error bursts, of untapped positions in said corrector memory extending from one of said predetermined taps to the next predetermined tap, a syndrome digit-former responsive to digits at said predetermined taps to form one or more sequences of syndrome digits, a locator control circuit responsive to said syndrome sequence to locate the leading edge of an error burst proceeding through the corrector memory, said locator control circuit including connections to inspect a set of syndrome digits each having a received digit constituent lying in a predetermined narrow region in said corrector memory and said locator control circuit responsive to the leading edge indication provided by the output based upon the pattern of one values in said set of syndrome digits, a correction control circuit connected to respond to the burst indictaing output sequence from said locator control circuit to correct a digit in said corrector memory that has been affected by said located error burst, said correction control circuit connected to employ a syndrome digit for which the said digit to be corrected is a constituent and the other as yet uncorrected digit constituents are spaced from said digit to be corrected a distance at least as great as said extended length.

2. The error burst corrector of claim 1 including a trailing edge detector circuit responsive to the syndrome sequence formed by the syndrome digit former and responsive to the leading edge indication provided by the locator control circuit, said circuit constructed to respond to an extended series of consecutive zero syndromes following detection of the leading edge of a burst and means responsive to said trailing edge detector circuit to terminate responding to a given burst indicating output of said locator control circuit.

3. The error burst corrector of claim 1 for use with a systematic code wherein said correction control circuit comprises circuitry for conducting the value of a syndrome digit and the stored information digit being decoded to means for linear combination to correct an information digit error, said correction control circuit connected to obtain said syndrome digit value from substantially the most recently formed syndrome digit of the syndrome sequence which has as a constituent the information digit currently being decoded.

4. The error burst corrector of claim 1 in combination with an encoder having an information memory and constructed to generate a systematic code, said encoder arranged to form a single serial stream of information and check digits, said encoder adapted to enter said information digits into said stream substantially simultaneously with entry of said information digits into the memory and to enter said check digits into said stream as said information digit proceeds through said information memory, including entering a first check digit checking each given information digit in close proximity to said given information digit in said stream, said error burst corrector constructed to receive said serial stream and to enter said information digits in said corrector memory, said syndrome former of said error burst corrector adapted to form a series of syndrome digits in corresponding order to the check digits in said stream, and said locator control circuit constructed to inspect the syndrome digit formed from said first check digit for a given information digit at the location in said corrector memory being inspected for the leading edge of the burst.

5. The error corrector of claim 1 wherein said series of untapped positions is of a length on the order of seventy or more digit positions.

6. The error burst corrector of claim 1 for use with a systematic convolutional code, the original information digits appearing directly in the encoded stream interspersed with said check digits, said corrector memory including an information memory through which the information digits proceed, said information memory having said taps at predetermined positions in accordance with said convolutional code, said series of untapped positions extending from one of said information taps to the next, said syndrome digit-former constructed to form syndrome digits from check digits arriving at said corrector and information digits at said taps of said information memory, said locator control circuit connected to detect a plurality of syndrome digits which check only information digits that lie in the region of the downstream side of said untapped series of information positions, said locator circuit responsive to the pattern of 1's in said plurality of syndrome digits to produce a burst-indicating output, said corrector circuit responsive to said burst-indicating output and connected to correct an information signal on said downstream side using a syndrome digit, which checks said digit to be corrected, and checks uncorrected information digits only in positions in said information memory on the upstream side of said untapped series.

7. The error burst corrector of claim 6 adapted to correct each information digit in succession, said corrector including a correction feed-back line adapted, after determination by said correction circuit of a correction for a given information digit, to feed back said correction to modify upstream syndromes checking said given information digit whereby said syndromes can be used in the processing of subsequent information digits.

8. The error burst corrector 6 including a random error correcting circuit having as inputs said plurality of syndrome digits, said corrector having mode selection means constructed to permit operation alternatively in the random correction mode and the burst correction mode, said mode selection means responsive to said locator circuit to shift to the burst correction mode.

9. The error burst corrector of claim 6 including a syndrome memory of substantially the same length as said information memory through which the syndrome digits proceed as said information digits proceed through said information memory, said locator control circuit responsive to the pattern of 1's in a plurality of syndrome digits in the neighborhood of the downstream end of said syndrome digit memory to produce a burst-indicating output, and said correction control circuit connected to respond to said burst-indicating output to effect said correction, using a syndrome digit which checks said information digit and checks uncorrected information digits only in positions in said information memory on the upstream side of said untapped series.

10. The error burst corrector of claim 9 having circuitry responsive to said stream of syndrome digits in said syndrome register after detection of said leading edge of a burst adapted to detect the trailing edge of the burst, said circuitry adapted upon detection of said trailing edge to reactivate the random error correction circuit.

11. The error burst corrector of claim 10 in which said leading and trailing edge detector circuits are combined, said leading edge detector responsive to the pattern of nonzero syndrome digit values and said trailing edge detector circuit responsive to a consecutive series of zero syndrome digit values.

12. The error corrector of claim 9 wherein said code is binary, said information memory comprises a tapped shift register, said syndrome memory comprises a tapped shift register, and said means to form syndrome digits comprises a modulo 2 adder with inputs comprising the contents of the tapped locations of said information digit memory and the currently received check digit.

13. The error burst corrector of claim 9 wherein said locator control circuit is connected to a plurality of positions in said syndrome memory to inspect a plurality of syndrome digits to determine the location of the leading edge of said error burst, said positions in said syndrome memory being so selected in relation to the predetermined taps of said information memory that a group of more than two of said syndrome digits checks a given information digit, and wherein a random error corrector circuit is connected to respond to said more than two syndrome digits and correct random errors in said given information digit.

14. The error corrector of claim 13 wherein said random error corrector is a threshold corrector constructed to evaluate a set of syndrome digits orthogonal upon said given information digit and to generate a correction digit based upon threshold logic.

15. The error corrector of claim 14 wherein said locator control circuit is connected to monitor the operation of said threshold corrector and to actuate said correction control circuit of said error burst corrector when any of a predetermined set of combinations of digital outputs from said threshold corrector occurs.

16. The error corrector of claim 15 constructed for use with a binary code wherein said occurrence is determined by a plurality of counters, each counter being activated by a syndrome digit one and being reset to zero after a fixed interval, the reception of a syndrome digit one while a predetermined number of counters are in operation being the signal for said burst-indicating output of said error burst corrector.

17. The error corrector of claim 16 wherein said plurality of counters comprises two leapfrogging counters and wherein said predetermined number of counters is two.

References Cited

UNITED STATES PATENTS

| | | | |
|---|---|---|---|
| 3,162,837 | 12/1964 | Meggitt | 340—146.1 |
| 3,163,848 | 12/1964 | Abramson | 340—146.1 |
| 3,213,426 | 10/1965 | Melas | 340—146.1 X |
| 3,273,119 | 9/1966 | Helm | 340—146.1 |

MALCOLM A. MORRISON, Primary Examiner

CHARLES E. ATKINSON, Assistant Examiner

U.S. Cl. X.R.

235—153

PO-1050
(5/69)

UNITED STATES PATENT OFFICE
CERTIFICATE OF CORRECTION

Patent No. 3,469,236 Dated September 23, 1969

Inventor(s) Robert G. Gallager

It is certified that error appears in the above-identified patent and that said Letters Patent are hereby corrected as shown below:

Column 5, line 14, delete "I" and substitute --L--. Column 6, line 59, delete "lead z" and substitute --lead $\bar{z}$--; line 61, delete "Physically all ones can be nega-" and substitute --A one on lead y (or zero on $\bar{y}$)--. Column 7, line 35, delete "counter" [first occurrence] and substitute --point--; line 40, delete "$N_2$" and substitute --$C_2$--. Column 9, line 15, delete "the leading edge indication provided by the" and substitute --said inspection to generate a burst-indicating--.

SIGNED AND SEALED
JUL 21 1970

(SEAL)
Attest:

Edward M. Fletcher, Jr.
Attesting Officer

WILLIAM E. SCHUYLER, JR.
Commissioner of Patents